(12) United States Patent
Lee et al.

(10) Patent No.: US 11,721,393 B2
(45) Date of Patent: *Aug. 8, 2023

(54) DUO-LEVEL WORD LINE DRIVER

(71) Applicant: Taiwan Semiconductor Manufacturing Company, Ltd., Hsinchu (TW)

(72) Inventors: Po-Hao Lee, Hsinchu (TW); Chia-Fu Lee, Hsinchu (TW); Yi-Chun Shih, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,376

(22) Filed: Feb. 3, 2022

(65) Prior Publication Data

US 2022/0157377 A1 May 19, 2022

Related U.S. Application Data

(63) Continuation of application No. 17/002,443, filed on Aug. 25, 2020, now Pat. No. 11,264,093.

(51) Int. Cl.
*G11C 7/12* (2006.01)
*G11C 11/00* (2006.01)
*G11C 13/00* (2006.01)

(52) U.S. Cl.
CPC .................................. *G11C 13/0028* (2013.01)

(58) Field of Classification Search
CPC ............ G11C 13/0028; G11C 11/1657; G11C 11/1673; G11C 11/1675; G11C 8/08;
(Continued)

(56) References Cited

U.S. PATENT DOCUMENTS

| 6,009,023 A | 12/1999 | Lu et al. |
| 8,391,097 B2 | 3/2013 | Chan et al. |

(Continued)

FOREIGN PATENT DOCUMENTS

| TW | 200733131 A | 9/2007 |
| TW | 201411038 A | 3/2014 |

(Continued)

OTHER PUBLICATIONS

Notice of Allowance on U.S. Appl. No. 17/002,443 dated Oct. 13, 2021.

*Primary Examiner* — Hien N Nguyen
(74) *Attorney, Agent, or Firm* — Foley & Lardner LLP (57) ABSTRACT

A circuit includes a first transistor and a second transistor cross-coupled with each other such that a source of the first transistor and a source of the second transistor are connected to a power supply, a gate of the first transistor is connected to a drain of the second transistor at a first node, a gate of the second transistor is connected to a drain of the first transistor at a second node. The circuit can provide a first level of a word line voltage to the memory cell by directly coupling the power supply configured at a first level to the memory cell through the second transistor and a third transistor, and provide a second level of the word line voltage by directly coupling the power supply configured at a second level to the memory cell through the second transistor and the third transistor.

20 Claims, 5 Drawing Sheets

(58) Field of Classification Search
CPC .............. G11C 13/004; G11C 13/0069; G11C 2213/79; G11C 2213/82; G11C 7/12; G11C 5/147
See application file for complete search history.

(56) References Cited

U.S. PATENT DOCUMENTS

| | | |
|---|---|---|
| 11,264,093 B1 * | 3/2022 | Lee .................... G11C 13/0028 |
| 2005/0116222 A1 | 6/2005 | Chou |
| 2016/0276005 A1 | 9/2016 | Jung et al. |
| 2017/0110164 A1 | 4/2017 | Cheng et al. |
| 2017/0110203 A1 | 4/2017 | Kwon et al. |

FOREIGN PATENT DOCUMENTS

| | | | |
|---|---|---|---|
| TW | 201435908 A | 9/2014 |
| TW | 201539448 A | 10/2015 |

* cited by examiner

DUO-LEVEL WORD LINE DRIVER

CROSS-REFERENCE TO RELATED APPLICATION

This application is related to and claims priority under 35 U.S. § 120 as a continuation of U.S. Utility application Ser. No. 17/002,443, filed Aug. 25, 2020, titled "DUO-LEVEL WORD LINE DRIVER," the entire contents of which are incorporated herein by reference for all purposes.

BACKGROUND

Memory circuits typically include a memory array including a number of memory cells coupled to an arrangement of word lines and bit lines. Each memory cell is coupled to a respective pair of a word line and a bit line. There may be a number of memory cells coupled to a given word line and/or a given bit line. The term "word line," as used herein, is sometimes referred to as a "row" of a memory array; and the term "bit line," as used herein, is sometimes referred to as a "column" of the same memory array.

A word line driver circuit (hereinafter "word line driver") is typically coupled to each word line in the memory circuit. Within the memory array, one word line is typically activated at a given time to access (e.g., read, write or refresh) corresponding memory cells coupled to the activated word line. At that time, the other word lines in the memory circuit may remain inactive. The voltage on an activated word line is controlled by a word line driver coupled to the activated word line. The selection of an active word line is determined by a word line address signal supplied to a word line decoder in the memory circuit. The word line decoder selectively activates the word line driver coupled to the addressed word line.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the context of emerging memory circuits (e.g., resistive random access memory (RRAM) circuits), it is sometimes desirable to apply higher word line voltages to the memory cells when writing the cells than reading the cells. The use of higher word line voltages can advantageously improve the efficiency in writing the memory cells, which can in turn improve various characteristics of the memory circuit such as, for example, memory capacity (i.e., density), latency, cycle time, and retention time, etc. As such, the corresponding word line driver may be configured to provide more than one level of a word line voltage.

In existing technical solutions, it is proposed to include a high voltage level shifter in the word line driver. However, such a high voltage level shifter typically includes at least one pair of cross-coupled transistors, and a pair of mirrored circuits respectively coupled to the cross-coupled transistors, which can disadvantageously compromise area and/or cost in the overall design of the memory circuit. Furthermore, given that the higher voltages applied to the memory cells can damage transistors associated with these cells over time, additional transistors are typically added in an output stage of the word line driver for managing voltages. These additional transistors being introduced within the word line driver is generally not desirable, especially considering their impact to the overall design, at least in terms of cost and performance. For an area-neutral design, the increase in transistor impedance using a cascade arrangement may be used. However, to properly operate such a cascaded portion, extra power is frequently needed to bias the cascaded portion partially because of the number of transistors (typically greater than 4) that constitute the cascaded portion. Thus, the existing word line drivers are not entirely satisfactory.

The present disclosure provides various embodiments of a word line driver that can provide at least two levels of a word line voltage, while occupying a half or less of the area of the existing word line driver. For example, the word line driver, as disclosed herein, includes a pair of cross-coupled transistors and contains no mirrored circuit coupled to the cross-coupled transistors. As such, the design of the disclosed word line driver can be significantly simplified, which can advantageously reduce the corresponding area occupied by the word line driver. Further, the disclosed word line driver includes a cascaded portion that can be formed by at most two transistors. Accordingly, less power may be consumed by the disclosed word line driver, when compared to the existing word line driver.

The embodiments of the disclosed word line driver can be used in various memory circuits, or components thereof, to present improved real estate usage while maintaining the performance. The memory circuit can include an embedded memory (e.g., a memory embedded within an IC) or a stand-alone (e.g., discrete) memory (e.g., a memory that is the primary component within an IC). Examples of the memory include, but are not limited to, volatile, nonvolatile, static, dynamic, read only, random access, flash, one-time programmable, multiple-time programmable, magnetoresistive phase-change memory (PCM), ferroelectric random access memory (FRAM), magnetic random access memory (MRAM), resistive random access memory (RRAM), etc. Embedded memories are incorporated within a larger functional block, generally termed a logic circuit, for example, a microprocessor, a digital processing device, a field programmable gate array (FPGA), an application-specific integrated circuit (ASIC), etc.

In general, integrated circuit (IC) fabrication technologies provide at least two different types of transistors. Input/output (I/O) transistors are an example of a first type. I/O transistors are designed to operate in a relatively high voltage environment, such as, for example, a 1.7-volt nominal environment. In order to withstand the relatively high voltage without gate oxide breakdown, I/O transistors are formed having a relatively thick gate oxide, such as, for example, greater than about 50 angstroms thick and relatively long channel lengths (e.g., about twice the length of thin-oxide transistors). Therefore, the first type of transistor, which is able to withstand relatively high voltages and has relatively thick gate oxide, may be referred to herein as a "thick-oxide transistor" or "thick-oxide FET."

On the other hand, logic transistors are an example of a second type of transistor provided in the IC fabrication technologies. Logic transistors are designed to operate in a lower voltage environment, such as, for example, a 1.1-volt nominal environment. Because the voltages applied to these transistors are lower than the voltages applied to a thick-oxide transistor, the gate oxide of logic transistors does not need to be as thick compared to the gate oxide of a thick-oxide device. For example, the gate oxide thickness of a typical logic transistor may be about 10 to 12 angstroms and the channel length short (e.g., at a minimum specified lithographic dimension). Therefore, the second type of transistor, which is able to withstand relatively low voltages and has relatively thin gate oxide, may be referred to herein as a "thin-oxide transistor" or "thin-oxide FET." In accordance with various embodiments of the present disclosure, each of the transistors included in the disclosed word line driver may be a thin-oxide transistor, which shall be discussed in further detail below.

Figure 1:
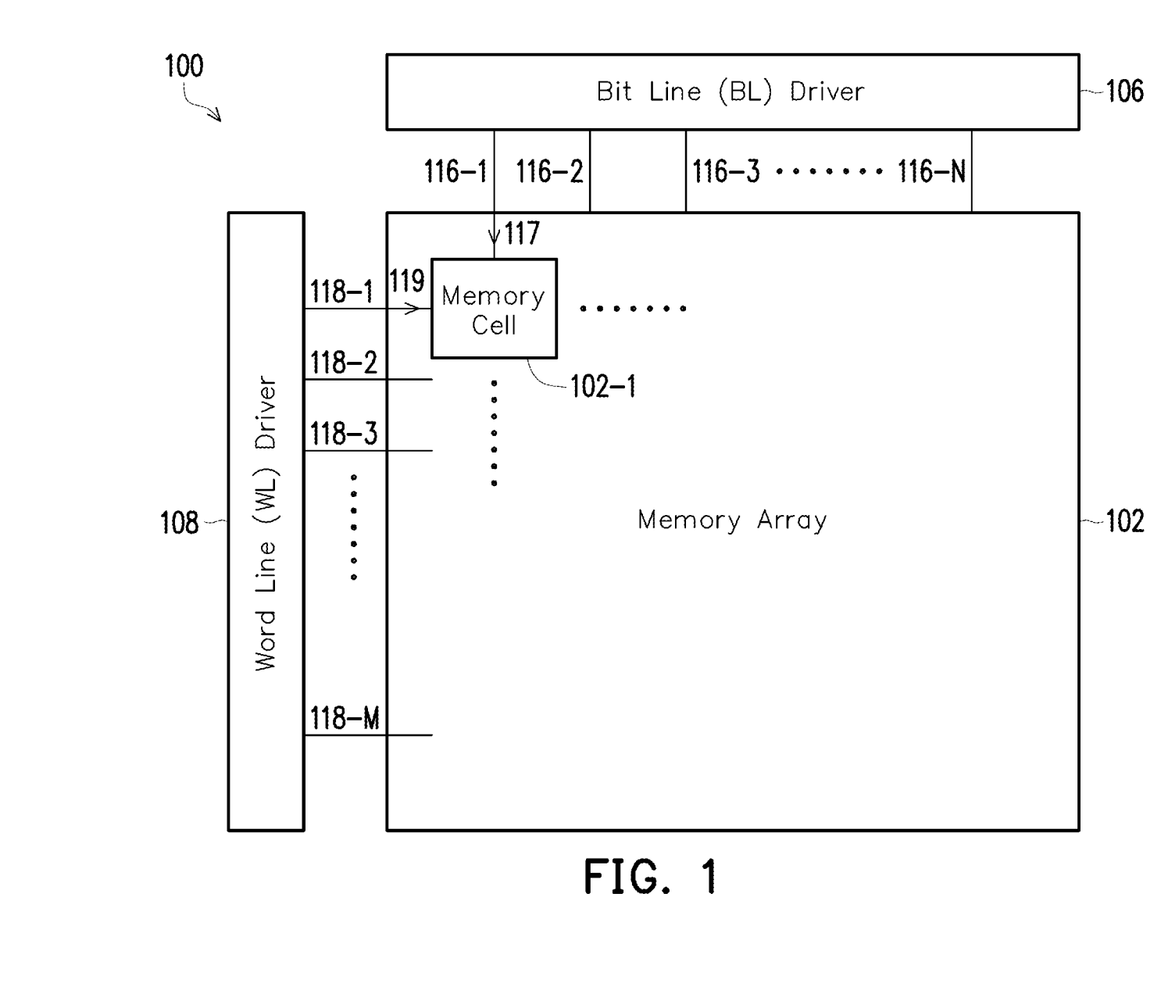
FIG. 1 illustrates a block diagram of a memory circuit, in accordance with some embodiments.

FIG. 1 illustrates a block diagram of an example memory circuit 100, in accordance with various embodiments. The memory circuit 100 includes a memory array 102, a bit line (BL) driver 106, and a word line (WL) driver 108. It is understood that the illustrated embodiment of the memory circuit 100 in FIG. 1 is simplified and thus, the memory circuit 100 can include one or more other blocks (or circuits) while remaining within the scope of the present disclosure. For example, the memory circuit 100 can include one or more multiplexers coupled between the memory array 102 and the BL driver 106, and between the memory array 102 and the WL driver 108, one or more input/output circuits (sense amplifiers), etc.

Referring still to FIG. 1, and in greater detail, the memory array 102 includes a number of memory cells (e.g., 102-1) arranged in a column-row configuration. Each of the memory cells is arranged at the interaction of a corresponding one of a number of columns and a corresponding one of a number of rows. Each column may correspond to a BL, and each row may correspond to a WL. As such, each memory cell is coupled to a corresponding pair of BL and WL, which can allow one or more other circuits (e.g., the BL driver, the WL driver, etc.) to access the memory cell through the pair of BL and WL. For example in FIG. 1, the memory cell 102-1 is coupled to the BL driver 106 through a pair of BL 116-1 and WL 118-1, which are one of a number of BLs (116-1, 116-2, 116-3 . . . 116-N) and one of a number of WLs (118-1, 118-2, 118-3 . . . 118-M), respectively, wherein N may correspond to a number of the columns of the memory array 102 and M may correspond to a number of the rows of the memory array 102.

Continuing with the above example, the BL driver 106 and the WL driver 108 may access the memory cell 102-1 by asserting (e.g., activating) the BL 116-1 and WL 118-1 based on a column address and a row address, respectively. In some embodiments, in response to asserting the BL 116-1, the BL driver 106 can apply a BL signal (e.g., BL signal 117) to the memory cell 102-1 via the asserted BL 116-1, whose signal level is determined based on a logic state to be written to or presented by the memory cell 102-1. In response to asserting the WL 118-1, the WL driver 108 can apply a WL signal (e.g., WL signal 119) to the memory cell 102-1 via the asserted WL 118-1, whose signal level is determined according to whether the memory cell 102-1 is being read or written. In accordance with some embodiments, the BL signal 117 and the WL signal 119 may each be a voltage signal, and accordingly the respective signal levels may be voltage levels. In some other embodiments, the BL signal 117 and the WL signal 119 may be current signals while remaining within the scope of the present disclosure.

Figure 2:
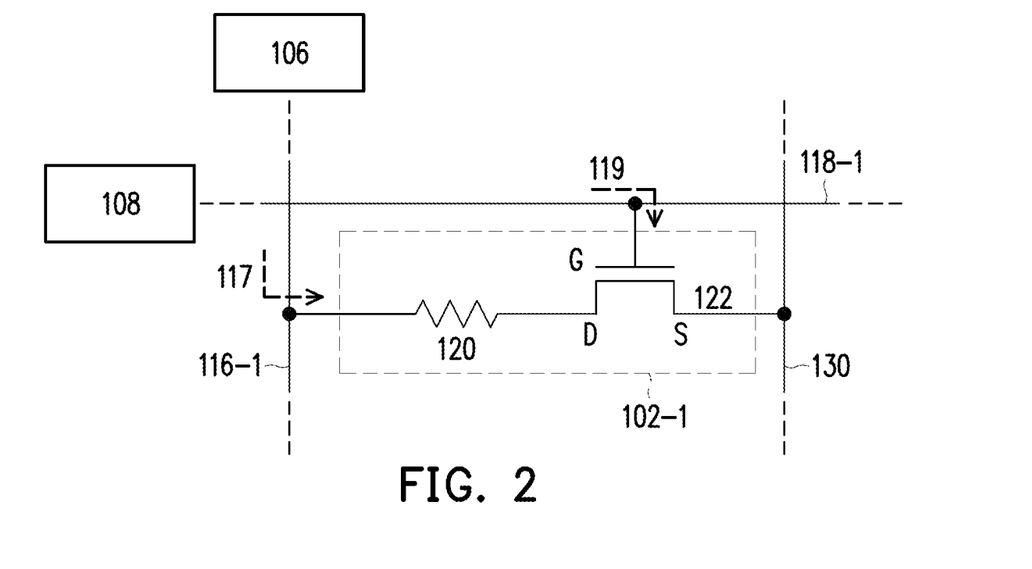
FIG. 2 illustrates a schematic diagram of a memory cell included in the memory circuit of FIG. 1, in accordance with some embodiments.

As mentioned above, the disclosed WL driver 108 can be utilized for various kinds of memories. FIG. 2, as a representative example, illustrates a schematic diagram in which the memory cell 102-1 includes an RRAM memory cell. It is understood that the memory cell 102-1 can include any of other types of memory cells (e.g., MRAM memory cell, DRAM memory cell, etc.) while remaining within the scope of the present disclosure. As shown in FIG. 2, the memory cell 102-1 includes a resistor 120 with a variable resistance and a transistor 122 coupled in series with the resistor 120. In some embodiments, the resistor 120 may be formed as a multi-layer stack, wherein the resistance of the resistor 120 varies with different voltages applied to the resistor 120. The transistor 122 coupled, in series, to the resistor 120 is generally referred to as a "selection transistor," or an "enablement transistor" that is configured to enable a conduction path to flow through the coupled resistor 120.

The memory cell 102-1, while being implemented as an RRAM cell, is formed as a three-terminal device that is coupled to three signal lines. For example, one of the ends of the resistor 120 not coupled to a drain of the transistor 122 is connected to the BL 116-1, a gate of the transistor 122 is connected to the WL 118-1, and a source of the transistor 122 is connected to a source line 130. As such, the memory cell 102-1 can be accessed through the signal lines.

For example, when writing the memory cell 102-1, the WL driver 108 may configure the WL signal 119 at a first level (hereinafter "write level") and then apply the WL signal 119 to the gate of the transistor 122 via the WL 118-1. In response, the BL driver 106 may configure the BL signal 117 at a certain level, depending on whether to write a high logic state or a low logic state to the memory cell 102-1, and then apply the BL signal 117 to the resistor 120 via the BL 116-1. On the other hand, when reading the memory cell 102-1, the WL driver 108 may configure the WL signal 119 at a second level (hereinafter "read level") and then apply the WL signal 119 to the gate of the transistor 122 via the WL 118-1. In response, the BL driver 106 may configure the BL signal 117 at a certain level and then apply the BL signal 117 to the resistor 120 via the BL 116-1. In some embodiments, the WL driver 108 may configure the write level to be substantially higher than the read level to improve the efficiency in writing the memory cell 102-1.

Figure 3:
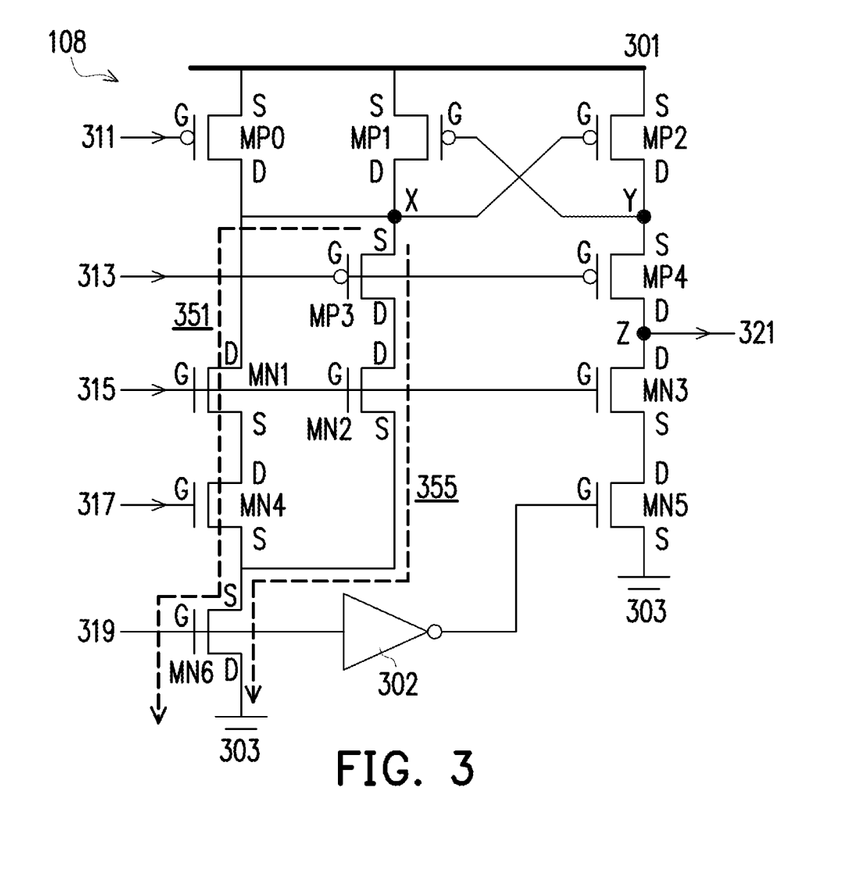
FIG. 3 illustrates a circuit diagram of a word line driver of the memory circuit of FIG. 1, in accordance with some embodiments.

FIG. 3 illustrates an example circuit diagram of the WL driver 108, in accordance with various embodiments. The WL driver 108 is configured to receive a number of control signals 311, 313, 315, 317, and 319 (which shall be respectively discussed below), and based on respective signal levels of the control signals, to provide a WL signal 321. Such a WL signal 321 can be provided to a memory cell via a corresponding WL for reading or writing the memory cell, that is substantially similar to the WL signal 119 as discussed above with respect to FIGS. 1 and 2. It is understood that the illustrated embodiment of the WL driver 108 in FIG. 3 is simplified and thus, the WL driver 108 can include one or more other components to perform respective function(s) while remaining within the scope of the present disclosure. For example, the WL driver 108 may include one or more decoders configured to identify which of the coupled WLs to be asserted based on a received row address so as to apply the generated WL signal 321 via the asserted WL.

Referring still to FIG. 3, and in greater detail, the WL driver 108 includes transistors MP0, MP1, MP2, MP3, MP4, MN1, MN2, MN3, MN4, MN5, and MN6, and an inverter 302. In some embodiments, the transistors MP1-MP4 each includes a p-type metal-oxide-semiconductor field-effect-transistor (pMOSFET), and the transistors MN1-MN6 each includes an n-type metal-oxide-semiconductor field-effect-transistor (nMOSFET). It is appreciated that each of the transistors MP1-MP4 and MN1-MN6 can include any of various other types of transistors (e.g., bipolar junction transistors, high-electron-mobility transistors, etc.) while remaining within the scope of the present disclosure. The transistors, MP1-MP4 and MN1-MN6, and the inverter 302 are coupled with one another between a first power supply 301 and a second power supply 303, which shall be discussed as follows.

For example, the transistors MP1 and MP2 are cross-coupled with each other. Specifically, a source of the transistor MP1 and a source of the transistor MP2 are connected to the power supply 301, a gate of the transistor MP1 is connected to a drain of the transistor MP2 at node Y, a gate of the transistor MP2 is connected to a drain of the transistor MP1 at node X. Further, the drain of the transistor MP1 and a source of the transistor MP3 are connected at the node X. The drain the transistor MP2 and a source of the transistor MP4 are connected at the node Y. Each of the transistors MP3 and MP4 is gated by the control signal 313. A drain of the transistor MP3 is connected to a drain of the transistor MN2. A drain of the transistor MP4 is connected to a drain of the transistor MN3 at node Z. Each of the transistors MN2 and MN3 is gated by the control signal 315. A source of the transistor MN2 is connected to a source of the transistor MN4 and a drain of the transistor MM. The transistors MN4 and MN6 are gated by the control signals 317 and 319, respectively. A source of the transistor MN6 is connected to the power supply 303. A source of the transistor MN3 is connected to a drain of the transistor MN5. A source of the transistor MN3 is connected to the power supply 303. The inverter 302 is configured to receive the control signal 319 at its input and provide a signal logically inverted to the control signal 319 at its output to a gate of the transistor MN5. A drain of the transistor MN4 is connected to a source of the transistor MN1. The transistor MN1 is also gated by the control signal 315. A drain of the transistor MN1 is connected to a drain of the transistor MP0. The transistor MP0 is gated by the control signal 311. A source of the transistor MP0 is connected to the power supply 301.

Figure 4:
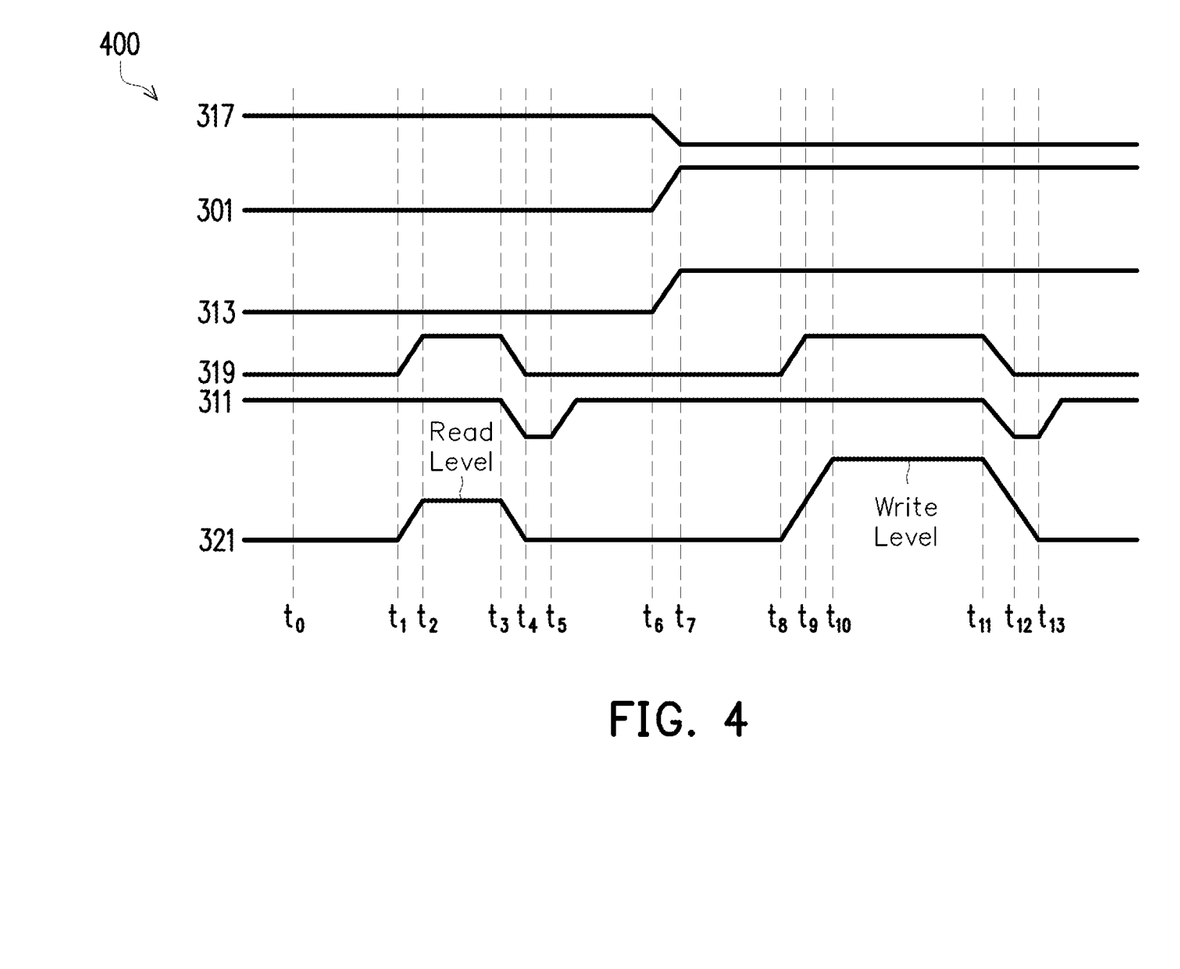
FIG. 4 illustrates a waveform diagram including respective waveforms of various signals when operating the word line driver of FIG. 3, in accordance with some embodiments.

The operation of the example WL driver 108 shown in FIG. 3 is described in conjunction with the waveform diagram 400 of FIG. 4. In FIG. 4, respective example signal levels of the control signals 311, 313, 317, and 319, the power supply 301, and the WL signal 321 are shown. Each of the control signals 311, 313, 317, and 319 and the power supply 301 varies between two signal levels over time to cause the WL driver 108 to generate the WL signal 321 at the read level and the write level, respectively. In various embodiments, the write level is substantially greater than the read level. In various embodiments, the control signal 315 (not shown in FIG. 4) may remain at a high logic state to keep the transistors MN1, MN2, and MN3 turned on during generating the read level and the write level of the WL signal 321. In various embodiments, a difference between the power supply 301 and the control signal 313 may remain fixed during generating the read level and the write level of the WL signal 321.

From time t0 to time t1, the control signal 317 is provided at a high logic state ("logic 1"). In some embodiments, when the control signal 317 is configured at logic 1, the WL driver 108 may be configured to provide the WL signal 321 at the read level. Accordingly, the WL driver 108 can provide such a WL signal 321 to a memory cell when reading the memory cell. During the period from time t0 to time t1, the power supply 301 may have been configured at a first level (e.g., about 1 volt); the control signal 313 may have been provided at a first level (e.g., about 0 volt); the control signal 319 is provided at a low logic state ("logic 0"); and the control signal 311 is provided at logic 1. With the control signal 313 configured at about 0 volt, the transistors MP3 and MP4 are turned on, which allows a voltage at the node X to be discharged (e.g., decreased) to about 0 volt (substantially equal to the signal level of the control signal 313) in response to a discharging path (propagating through or from the node X) being formed, which shall be discussed below.

In some embodiments, the period in which the control signal 319 is at logic 0 and the control signal 317 is at logic 1 (e.g., the period from time t0 to time t1) may sometimes be referred to as a read standby period. During the read standby period, the WL driver 108 may not yet transition the WL signal 321 to the read level, e.g., the WL signal 321 remaining at 0 volt. As the transistor MP4 is turned on, the transistor MP1 can be turned on, with the cross-coupled transistor MP2 turned off, which causes a voltage at the node X to be substantially equal to the first level of the power supply 301 (e.g., about 1 volt).

From time t1 to time t2, the control signal 319 is transitioned from logic 0 to logic 1, which can in turn transition the WL signal 321 from about 0 volt to the read level. In some embodiments, the read level of the WL signal 321 may be substantially equal to the first level of the power supply 301. For example, in response to the control signal 319 transitioning to logic 1, the transistor MN6 is turned on. Upon the transistor MN6 being turned on, a discharging path 351 may be formed from the node X, through the transistors MN1, MN4, and MN6, and to the power supply 303 (e.g., ground) so as to pull down the voltage at the node X from about 1 volt to be substantially equal to the signal level of the control signal 313 (e.g., about 0 volt). As such, the transistor MP2 can be turned on, with the cross-coupled transistor MP1 turned off, thereby causing the first level of the power supply 301 (e.g., about 1 volt) to be coupled to the node Y. As the transistor MP4 has been turned on by the control signal 313 configured at about 0 volt, the first level of the power supply 301 can be provided to the node Z, which causes the WL signal 321 to increase to be substantially equal to the first level of the power supply 301 (e.g., about 1 volt). Referring again to the control signal 319 that transitions to logic 1, the transistor MN5, which is gated by the logically inverted control signal 319, is turned off. As such, no discharging path is established from the node Z, through the transistors MN3 and MN5, and to the power supply 303 (ground), which can efficiently couple the first level of the power supply 301 to the node Z.

From time t2 to time t3, the signal levels of the control signals 311, 313, 317, and 319 and the power supply 301 may remain unchanged. As such, the WL driver 108 may provide the WL signal 321 at the read level during the period from time t2 to time t3. The period can be predefined according to a type of the memory cell coupled to the WL driver 108, in some embodiments.

From time t3 to time t4, the control signal 319 is transitioned from logic 1 to logic 0, the WL driver 108 may stop providing the WL signal 321, e.g., providing the WL signal 321 at about 0 volt. Specifically, when the control signal 319 is at logic 0, the transistor MN6 is turned off and thus, the discharging path 351 is disconnected, which causes the transistor MP2 to be gradually turned off to stop providing the WL signal 321 at a non-zero level. In some embodiments, subsequently to providing the WL signal 321 at a non-zero level (e.g., at time t3), the transistor MP0 may be turned on by transitioning the control signal 311 from logic 1 to logic 0. As such, the first level of the power supply 301 can be coupled to the node X through the turned-on transistor MP0, which can pull up the voltage at the node X from about 0 volt to about 1 volt. Consequently, the transistor MP2 can be turned off more quickly, which can advantageously reduce power consumption of the WL driver 108. The control signal 311 may remain at logic 0 for a relatively short period of time. For instance, a period from time t4 to time t5 is about 1-2 nanoseconds, and after time t5, the control signal 311 is transitioned back to logic 1.

From time t6 to time t7, the control signal 317 is transitioned from logic 1 to logic 0. In some embodiments, when the control signal 317 is configured at logic 0, the WL driver 108 may be configured to provide the WL signal 321 at the write level. Accordingly, the WL driver 108 can provide such a WL signal 321 to a memory cell when writing the memory cell. During the period from time t6 to time t7, the power supply 301 is configured to increase to a second level (e.g., about 2 volt); the control signal 313 is configured to increase to a second level (e.g., about 1 volt); the control signal 319 remains at logic 0; and the control signal 311 remains at logic 1. With the control signal 313 configured at about 1 volt, the transistors MP3 and MP4 are still turned on, which allows a voltage at the node X to be discharged (e.g., decreased) to about 1 volt (substantially equal to the signal level of the control signal 313) in response to a discharging path (propagating through or from the node X) being formed. From time t7 to time t8, the control signal 319 remains at logic 0, which keeps the transistor MN6 turned off. That is, no discharging path can be established from the node X through the transistor MN6 to ground.

In some embodiments, the period in which the control signal 319 is at logic 0 and the control signal 317 is at logic 0 (e.g., the period from time t7 to time t8) may sometimes be referred to as a write standby period. During the write standby period, the WL driver 108 may not yet transition the WL signal 321 to the write level, e.g., the WL signal 321 remaining at 0 volt. As the transistor MP4 is still turned on, the transistor MP1 can be turned on, with the cross-coupled transistor MP2 turned off, which causes the voltage at the node X to be substantially equal to the second level of the power supply 301 (e.g., about 2 volts).

From time t8 to time t9, the control signal 319 is again transitioned from logic 0 to logic 1, which can in turn transition the WL signal 321 from about 0 volt to the write level. In some embodiments, the write level of the WL signal 321 may be substantially equal to the second level of the power supply 301. For example, in response to the control signal 319 transitioning to logic 1, the transistor MN6 is turned on. Upon the transistor MN6 being turned on, a discharging path 355 may be formed from the node X, through the transistors MN2 and MN6 (as the transistor MN4 is turned off by the control signal 317 configured at logic 0), and to the power supply 303 (e.g., ground) so as to pull down the voltage at the node X from about 2 volts to be substantially equal to the signal level of the control signal 313 (e.g., about 1V). As such, the transistor MP2 can still be turned on (as the second level of the power supply 301 is about 2 volts), with the cross-coupled transistor MP1 turned off, thereby causing the second level of the power supply 301 (e.g., about 2 volts) to be coupled to the node Y. As the transistor MP4 has still been turned on by the control signal 313 configured at about 1 volt, the second level of the power supply 301 can be provided to the node Z, which causes the WL signal 321 to increase to be substantially equal to the second level of the power supply 301 (e.g., about 2 volt) at time t10. Referring again to the control signal 319 that transitions to logic 1, the transistor MN5, which is gated by the logically inverted control signal 319, is turned off. As such, no discharging path is established from the node Z, through the transistors MN3 and MN5, and to the power supply 303 (e.g., ground), which can efficiently couple the second level of the power supply 301 to the node Z.

As mentioned above, each of the transistors of the WL driver 108 includes a thin-oxide transistor, which can provide better performance but may be subjected to oxide breakdown while a voltage across the respective oxide becomes substantially large. Using the configuration as shown in FIG. 3, although a relative large voltage (e.g., 2 volts of the WL signal 321) is provided through the transistors at the output stage of the WL driver 108 (e.g., transistors MP2 and MP4), such transistors may still be immune from the oxide breakdown. This is because the voltage at the node X is clamped by the transistor MP3 at about 1 volt, which causes the respective voltages across the source/drain and gate of the transistor MP2 and across the source/drain and gate of the transistor MP4 to be about 1 volt, instead of the relatively large voltage (e.g., 2 volts) configured at the power supply 301.

From time t10 to time t11, the signal levels of the control signals 311, 313, 317, and 319 and the power supply 301 may remain unchanged. As such, the WL driver 108 may provide the WL signal 321 at the write level during the period from time t10 to time t11. The period can be pre-defined according to a type of the memory cell coupled to the WL driver 108, in some embodiments.

From time t11 to time t12, the control signal 319 is transitioned from logic 1 to logic 0, the WL driver 108 may stop providing the WL signal 321, i.e., providing the WL signal 321 at about 0 volt. Specifically, when the control signal 319 is at logic 0, the transistor MN6 is turned off and thus, the discharging path 355 is disconnected, which causes the transistor MP2 to be gradually turned off to stop providing the WL signal 321 at a non-zero level. In some embodiments, subsequently to providing the WL signal 321 at a non-zero level (e.g., at time t11), the transistor MP0 may be turned on by transitioning the control signal 311 from logic 1 to logic 0. As such, the second level of the power supply 301 can be coupled to the node X through the turned-on transistor MP0, which can pull up the voltage at the node X from about 1 volt to about 2 volts. Consequently, the transistor MP2 can be turned off more quickly, which can advantageously reduce power consumption of the WL driver 108. The control signal 311 may remain at logic 0 for a relatively short period of time. For instance, a period from time t12 to time t13 is about 1-2 nanoseconds, and after time t13, the control signal 311 is transitioned back to logic 1.

Figure 5:
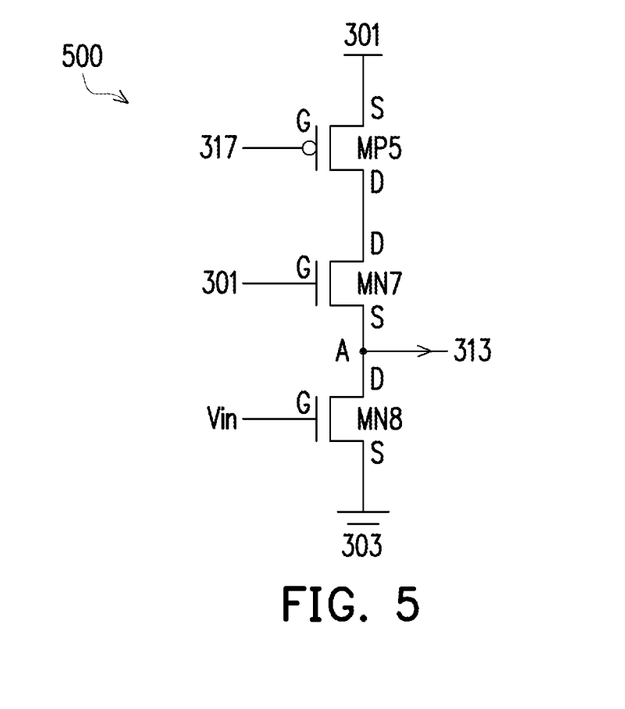
FIG. 5 illustrates a circuit diagram of a control signal generation circuit coupled to (or integrated with) the word line driver of FIG. 3, in accordance with some embodiments.

In some embodiments, the transistors MP3 and MP4 may constitute a cascaded circuit. To bias the cascaded circuit, the WL driver 108, as disclosed herein, can use a control signal generation circuit including a source follower to provide the control signal 313 based on a reference voltage. The control signal generation circuit 500 can be coupled to or otherwise integrated with the WL driver 108. In some embodiments, the source follower can determine a signal level of the control signal 313 using the reference voltage and a signal level of the power supply 301. FIG. 5 illustrates an example circuit diagram of a control signal generation circuit 500, in accordance with various embodiments.

As shown, the control signal generation circuit 500 includes transistors MP5, MN7, and MN8. In some embodiments, the transistor MP5 includes a pMOSFET, and each of the transistors MN7 and MN8 includes an nMOSFET. It is appreciated that each of the transistors MP5 and MN7-MN8 can include any of various other types of transistors (e.g., bipolar junction transistors, high-electron-mobility transistors, etc.) while remaining within the scope of the present disclosure. The transistors MPS and MN7-MN8 are coupled with one another between the power supply 301 and the power supply 303, which shall be discussed as follows.

For example, a source of the transistor MPS is connected to the power supply 301, a drain of the transistor MPS is connected to a drain of the transistor MN7, and the transistor MPS is gated by the control signal 317. A source of the transistor MN7 and a drain of the transistor MN8 are connected at a node A, the transistor MN7 is gated by the power supply 301, a source of the transistor MN8 is connected to the power supply 303, and the transistor MN8 is gated by a reference voltage Vin.

In some embodiments, the transistor MN7 can function as a source follower, and the transistor MN8 can provide a reference voltage to the source follower. The power supply 301 (received at the gate of the transistor MN7) may serve as an input of the source follower that provides the control signal 313 as an output at the node A (at the source of the transistor MN7). As such, the signal level of the control signal 313 can be determined as: the signal level of the power supply 301 minus the reference voltage Vin (control signal 313=power supply 301−reference voltage Vin). This is because when the transistors MN7 and MN8 are conducted (e.g., at the saturation region) by the power supply 301 and reference voltage Vin, respectively, the voltage across the gate and source of the transistor MN7 (power supply 301−control signal 313) and the voltage across the gate and the source of the transistor MN8 (reference voltage Vin) are equal. That is, power supply 301−control signal 313=reference voltage Vin, which induces the relationship: the signal level of the control signal 313 equal to the signal level of the power supply 301 minus the reference voltage Vin. According to various embodiments, the reference voltage Vin may be configured between about 1 volt to about 1.3 volts. Based on the above discussions, the maximum voltage that can be present across the source/drain of each of the cascaded transistors MP3 and MP4 (FIG. 3) can be advantageously limited to a level of the reference voltage Vin, e.g., about 1 volt to about 1.3 volts.

Specifically, when reading the memory cell coupled to the WL driver 108, the control signal 317 is provided at logic 1, as discussed above with respect to FIG. 4. In response, the transistor MP5 of the control signal generation circuit 500 is turned off. Thus, a voltage at the node A (the signal level of the control signal 313) is pulled down to the power supply 303 (e.g., ground), i.e., the first level of the power supply 301 (about 1 volt)−the reference voltage Vin (about 1 volt). On the other hand, when writing the memory cell, the control signal 317 is provided at logic 0 (and the power supply 301 is configured at the second level, about 2 volts), which turns on the transistor MP5. Upon the transistor MP5 being turned on, the second level of the power supply 301 can be coupled to the drain of the transistor MN7, which causes the voltage at the node A to be equal to the second level of the power supply 301 minus the reference voltage Vin, e.g., about 1 volt.

Figure 6:
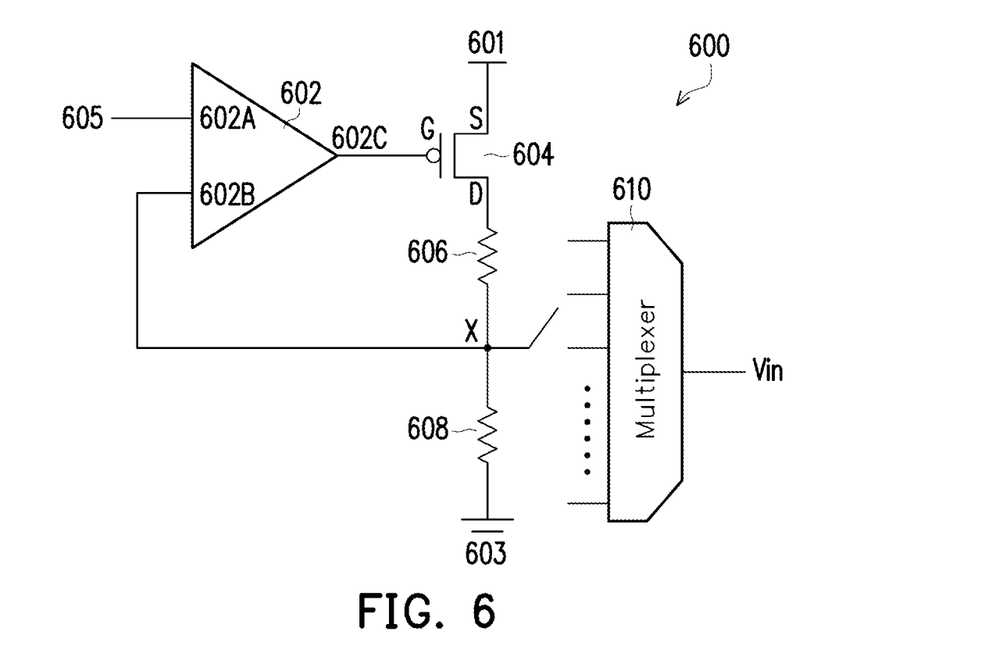
FIG. 6 illustrates a circuit diagram of a bias generation circuit coupled to (or integrated with) the control signal generation circuit of FIG. 5, in accordance with some embodiments.

FIG. 6 illustrates an example circuit diagram of a bias generation circuit 600 to generate the reference voltage Vin, in accordance with various embodiments. The bias generation circuit 600 can be coupled to or otherwise integrated with the control signal generation circuit 500. As shown, the bias generation circuit 600 includes an operational amplifier 602, a transistor 604 (e.g., a pMOSFET), a first resistor 606, a second resistor 608, and a multiplexer 610. The components of the bias generation circuit 600 are coupled to one another between a first power supply 601 (e.g., an input/output supply voltage) and a second power supply 603 (e.g., ground). The operational amplifier 602 has two inputs 602A (e.g., an inverting input) and 602B (e.g., a non-inverting input), and one output 602C. The input 602A is configured to receive a bandgap voltage 605, the input 602B is connected to a node X, and the output 602C is connected to a gate of the transistor 604. A source of the transistor 604 is connected to the power supply 601, and a drain of the transistor 604 is coupled to the power supply 603 via the resistors 606 and 608 with the node X connected therebetween. Further, a voltage at the node X can be varied from a first value to a second value (e.g., about 1 volt to about 1.3 volt) by changing a ratio of a resistance value of the resistor 606 to a resistance value of the resistor 608. The multiplexer 610 is configured to select one of the value ranging from the first value to the second value as the reference voltage Vin.

Figure 7:
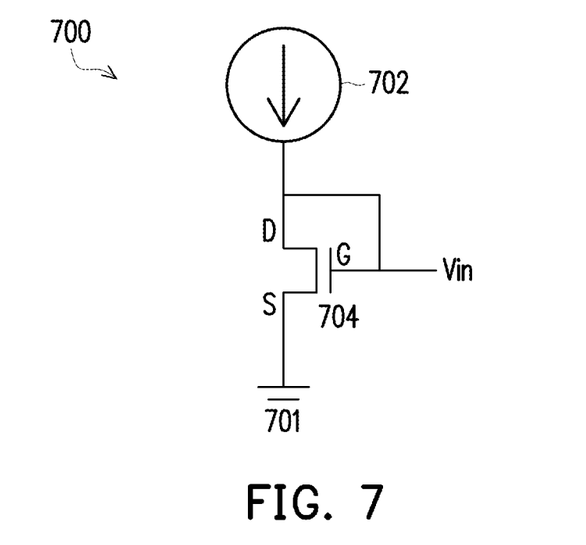
FIG. 7 illustrates a circuit diagram of another bias generation circuit coupled to (or integrated with) the control signal generation circuit of FIG. 5, in accordance with some embodiments.

FIG. 7 illustrates an example circuit diagram of another bias generation circuit 700 to generate the reference voltage Vin, in accordance with various embodiments. The bias generation circuit 700 can be coupled to or otherwise integrated with the control signal generation circuit 500. As shown, the bias generation circuit 700 includes a current source 702 and a transistor 704 (e.g., an nMOSFET). A gate and a drain of the transistor 704 is connected to each other, which is sometimes referred to as a "diode-connected" transistor that causes the transistor 704 to operate under a saturation mode. A source of the transistor 704 is connected to a power supply 701 (e.g., ground). The current source 702 is configured to provide a constant current to the diode-connected transistor 704 that is approximately equal to the saturated current flowing through the transistor 704. As such, the bias generation circuit 700 can provide a steady reference voltage Vin based on the current.

Figure 8:
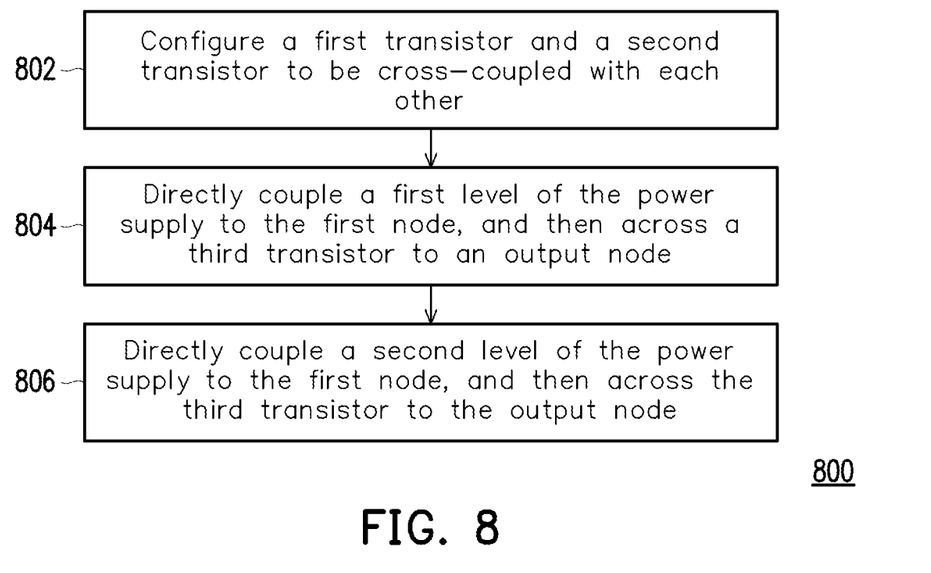
FIG. 8 illustrates a flow chart of a method to operate the word line driver of FIG. 3, in accordance with some embodiments.

FIG. 8 illustrates a flow chart of an example method 800 to operate a WL driver for providing at least two levels of WL signal, in accordance with various embodiments. For example, the WL driver 108, as disclosed herein, can perform the operations of the method 800 to provide at least two levels of a WL signal (e.g., 119 as discussed in FIGS. 1-2, 321 as discussed in FIG. 3-4). As such, the following embodiment of the method 800 will be described in conjunction with FIGS. 1-3. The illustrated embodiment of the method 800 is merely an example. Therefore, it shall be understood that any of a variety of the operations of the method 800 may be omitted, re-sequenced, and/or added while remaining within the scope of the present disclosure.

The method 800 starts with operation 802 of configuring a first transistor and a second transistor to be cross-coupled with each other, in accordance with various embodiments. As such, a source of the first transistor (e.g., MP1 of FIG. 3) and a source of the second transistor (e.g., MP2 of FIG. 3) are connected to a power supply (e.g., 301 of FIG. 3), a gate of the first transistor is connected to a drain of the second transistor at a first node (e.g., node Y of FIG. 3), a gate of the second transistor is connected to a drain of the first transistor at a second node (e.g., node X of FIG. 3). Continuing with the above example, each of the first transistors and the second transistors, MP1 and MP2, can be coupled to a portion of a cascaded circuit. For instance in FIG. 3, at its drain, the first transistor MP1 is coupled to the transistor MP3; and at its drain, the second transistor MP2 is coupled to the transistor MP4, wherein the transistors MP3 and MP4 can function as a cascaded circuit at the output stage of the WL driver 108.

The method 800 proceeds to operation 804 of directly coupling a first level of the power supply to the first node and then across a turned-on third transistor to an output node, in accordance with various embodiments. Continuing with the above example, the power supply 301 can be configured at a first level (e.g., 1 volt). In response, the WL driver 108 can directly couple the first level of the power supply 301 to the node Y, and then across a turned-on transistor (e.g., MP4) to an output node (e.g., node Z of FIG. 3). In some embodiments, each of the transistors MP3 and MP4 is gated by a control signal (e.g., 313 of FIG. 3) such that the transistors MP3 and MP4 can remain turned on in accordance with the varying level of the power supply 301. For example, when the power supply 301 is configured at the first level (e.g., 1 volt), the control signal 313 can be configured at about 0 volt to allow the node X to be discharged to ground thereby turning on the transistor MP2 and then coupling the first level of the power supply 301 through the transistor MP2 (and the already turned-on transistor MP4) to the output node Z. Therefore, the first level of the power supply 301 can be provided to the output node Z as the WL signal 321.

The method 800 proceeds to operation 806 of directly coupling a second level of the power supply to the first node and then across the turned-on third transistor to the output node, in accordance with various embodiments. Continuing with the above example, the power supply 301 can be configured at a second level (e.g., 2 volts). In response, the WL driver 108 can directly couple the second level of the power supply 301 to the node Y, and then across the turned-on transistor (e.g., MP4) to the output node (e.g., node Z of FIG. 3). In some embodiments, each of the transistors MP3 and MP4 is gated by a control signal (e.g., 313 of FIG. 3) such that the transistors MP3 and MP4 can remain turned on in accordance with the varying level of the power supply 301. For example, when the power supply 301 is configured at the second level (e.g., 2 volts), the control signal 313 can be configured at about 1 volt to allow the node X to be discharged to about 1 volt thereby still turning on the transistor MP2 and then coupling the second level of the power supply 301 through the transistor MP2 (and the already turned-on transistor MP4) to the output node Z. Therefore, the second level of the power supply 301 can be provided to the output node Z as the WL signal 321. It is beneficial to change the signal level of the control signal 313 according to the signal level of the power supply 301, as the transistors at the output stage of the WL driver 108 (e.g., transistors MP3 and MP4) may not experience a relatively large voltage difference across the respective oxides when the WL driver 108 is configured to provide a relatively large output voltage.

In one aspect of the present disclosure, a circuit includes a first transistor and a second transistor cross-coupled with each other such that a first source/drain of the first transistor and a first source/drain of the second transistor are connected to a power supply, a gate of the first transistor is connected to a second source/drain of the second transistor at a first node, a gate of the second transistor is connected to a second source/drain of the first transistor at a second node. The circuit is configured to provide a memory cell with a first level of a word line voltage when reading the memory cell and with a second level of the word line voltage when writing the memory cell, respectively. The circuit is configured to provide the first level of the word line voltage to the memory cell by directly coupling the power supply configured at a first level to the memory cell through the second transistor and a third transistor, and provide the second level of the word line voltage by directly coupling the power supply configured at a second level to the memory cell through the second transistor and the third transistor.

In another aspect of the present disclosure, a circuit includes a first transistor and a second transistor cross-coupled with each other such that a source of the first transistor and a source of the second transistor are connected to a power supply, a gate of the first transistor is connected to a drain of the second transistor at a first node, a gate of the second transistor is connected to a drain of the first transistor at a second node. The circuit includes a third transistor having a source connected to the first node. The circuit includes a fourth transistor having a source connected to the second node. The circuit is configured to generate, at a drain of the third transistor, an output voltage at a first level by coupling a first level of the power supply to the drain of the third transistor through the second transistor and the third transistor and at a second level by coupling a second level of the power supply to the drain of the third transistor through the second transistor and the third transistor, respectively. The second level of the power supply is substantially greater than the first level of the power supply. The second level of the output voltage is substantially greater than the first level of the output voltage.

In yet another aspect of the present disclosure, a method includes configuring a first transistor and a second transistor to be cross-coupled with each other such that a source of the first transistor and a source of the second transistor are connected to a power supply, a gate of the first transistor is connected to a drain of the second transistor at a first node, a gate of the second transistor is connected to a drain of the first transistor at a second node. The method includes in response to the power supply being configured at a first level, directly coupling the first level of the power supply to the first node and then across a turned-on third transistor to an output node. The method includes in response to the power supply being configured at a second level substantially greater than the first level, directly coupling the second level of the power supply to the first node and then across the turned-on third transistor to the output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first transistor and a second transistor cross-coupled with each other, wherein the first transistor and the second transistor are coupled to a power supply at their respective sources;
   a third transistor connected to the second transistor at a first node;
   a fourth transistor connected to the first transistor at a second node;
   wherein the first through fourth transistors have a same conductive type; and
   wherein the driver circuit is configured to provide, through the second transistor and the third transistor, an output voltage at a first level based on a first level of the power supply and at a second level based on a second level of the power supply, respectively.

2. The circuit of claim 1, wherein the output voltage is configured at the first level when a memory cell, that receives the output voltage as its word line voltage, is being read, and wherein the output voltage is configured at the second level when the memory cell is being written.

3. The circuit of claim 2, wherein the second level of the power supply is substantially greater than the first level of the power supply, and the second level of the output voltage is substantially greater than the first level of the output voltage.

4. The circuit of claim 1, wherein when the first level of the output voltage is provided, the third transistor is turned on by a first control signal configured at a first level, and when the second level of the output voltage is provided, the third transistor is turned on by the first control signal configured at a second level.

5. The circuit of claim 4, wherein when the first level of the output voltage is provided, a voltage at the second node is decreased to the first level of the first control signal through a first discharging path, and a voltage at the first node is substantially equal to the first level of the power supply.

6. The circuit of claim 4, wherein when the second level of the output voltage is provided, the voltage at the second node is decreased to the second level of the first control signal through a second discharging path, and the voltage at the first node is substantially equal to second level of the power supply.

7. The circuit of claim 6, wherein the second discharging path includes a fourth transistor turned on by the first control signal configured at the second level, and wherein the voltage at the second node is clamped at the second level of the first control signal by the fourth transistor.

8. The circuit of claim 4, further comprising:
   a fifth transistor;
   a sixth transistor; and
   a seventh transistor,
   wherein the fifth transistor has a first source/drain connected to the power supply and a second source/drain connected to a first source/drain of the sixth transistor, and the fifth transistor is selectively turned on based on whether to read or write a memory cell that receives the output voltage as its word line voltage,
   wherein the sixth transistor has a second source/drain connected to a first source/drain of the seventh transistor at a third node, and the sixth transistor is gated by the power supply,
   wherein the seventh transistor has a second source/drain connected to ground, and the seventh transistor is gated by a reference voltage, and
   wherein a voltage at the third node determines the first level or the second level of the first control signal.

9. The circuit of claim 8, wherein the first level of the first control signal is equal to the first level of the power supply minus the reference voltage, and the second level of the first control signal is equal to the second level of the power supply minus the reference voltage.

10. The circuit of claim 9, wherein when the power supply is at either the first level or the second level, a voltage difference across the first source/drain and the gate of the second transistor and a voltage difference across a first source/drain and a gate of the third transistor each remains substantially equal to the reference voltage.

11. The circuit of claim 1, wherein each of the first, second, third, and fourth transistors includes a p-type metal-oxide-semiconductor field-effect-transistor (pMOSFET).

12. A circuit, comprising:
   a first transistor and a second transistor cross-coupled with each other, wherein the first transistor and second transistors are coupled to a power supply at their respective sources,
   a third transistor connected to a source of the second transistor at a first node; and
   a fourth transistor connected to a source of the first transistor at a second node;
   wherein the third and fourth transistors are gated by a first control signal;
   wherein a voltage difference between the power supply and the first control signal remains about the same such that the driver circuit generates, at a drain of the third transistor, an output voltage at a first level when the power supply is provided at a first level and at a second level when the power supply is provided at a second level, respectively.

13. The circuit of claim 12, wherein the first control signal is configured to be at a first level when generating the output voltage at the first level and at a second level when generating the output voltage at the second level, respectively.

14. The circuit of claim 13, wherein when generating the output voltage at the first level, a voltage at the second node is decreased to the first level of the first control signal through a first discharging path, and a voltage at the first node is substantially equal to the first level of the power supply.

15. The circuit of claim 13, wherein when generating the output voltage at the second level, the voltage at the second node is decreased to the second level of the first control signal through a second discharging path including the fourth transistor, and the voltage at the first node is substantially equal to second level of the power supply.

16. The circuit of claim 15, wherein the voltage at the second node is clamped at the second level of the first control signal by the fourth transistor.

17. The circuit of claim 12, wherein the output voltage is provided to a memory cell that receives the output voltage as a word line voltage.

18. The circuit of claim 17, wherein the output voltage is configured at the first level when the memory cell is being read, wherein the output voltage is configured at the second level when the memory cell is being written, wherein the second level of the power supply is substantially greater than the first level of the power supply, and wherein the second level of the output voltage is substantially greater than the first level of the output voltage.

19. A method, comprising:
configuring a first transistor and a second transistor as cross-coupled with each other such that a source of the first transistor and a source of the second transistor are connected to a power supply, a gate of the first transistor is connected to a drain of the second transistor at a first node, a gate of the second transistor is connected to a drain of the first transistor at a second node;
in response to the power supply being configured at a first level, turning on a third transistor by a control signal configured at a first level, thereby directly coupling the first level of the power supply to the first node and then across the turned-on third transistor to an output node; and
in response to the power supply being configured at a second level substantially greater than the first level, turning on the third transistor by the control signal configured at a second level, thereby directly coupling the second level of the power supply to the first node and then across the turned-on third transistor to the output node.

20. The method of claim 19, wherein a first voltage difference between first level of the power supply and the first level of the control signal is about the same as a second voltage difference between second level of the power supply and the second level of the control signal.

* * * * *